(12) United States Patent
Liu et al.

(10) Patent No.: US 12,309,999 B2
(45) Date of Patent: May 20, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Youming Liu, Hefei (CN); Deyuan Xiao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 500 days.

(21) Appl. No.: 17/816,436

(22) Filed: Aug. 1, 2022

(65) Prior Publication Data

US 2023/0389278 A1 Nov. 30, 2023

Related U.S. Application Data

(63) Continuation of application No. PCT/CN2022/098017, filed on Jun. 10, 2022.

(30) Foreign Application Priority Data

May 31, 2022 (CN) .......................... 202210610541.0

(51) Int. Cl.
*H10B 12/00* (2023.01)

(52) U.S. Cl.
CPC ............. *H10B 12/30* (2023.02); *H10B 12/05* (2023.02); *H10B 12/482* (2023.02); *H10B 12/488* (2023.02)

(58) Field of Classification Search
CPC ...... H10B 12/30; H10B 12/05; H10B 12/482; H10B 12/488; H10B 12/00; H10B 12/01; G11C 11/403
See application file for complete search history.

(56) References Cited

U.S. PATENT DOCUMENTS

| 5,386,132 A | 1/1995 | Wong |
| 6,756,652 B2 | 6/2004 | Yano et al. |

(Continued)

FOREIGN PATENT DOCUMENTS

| CN | 1458683 A | 11/2003 |
| CN | 1499639 A | 5/2004 |

(Continued)

OTHER PUBLICATIONS

European Patent Office, Extended European Search Report Issued in Application No. 22924558.4, Sep. 10, 2024, Germany, 8 pages.

(Continued)

*Primary Examiner* — David Vu
(74) *Attorney, Agent, or Firm* — Kilpatrick Townsend & Stockton LLP

(57) ABSTRACT

The present disclosure relates to the technical field of semiconductors, and provides a semiconductor structure and a manufacturing method thereof. The semiconductor structure includes: a substrate; a memory cell array, located on the substrate, the memory cell array includes a plurality of transistor units, each of the transistor units includes a first transistor and a second transistor extending along a first direction and electrically connected to each other, and the first direction is parallel to the substrate; a first bit line, penetrating the memory cell array and electrically connected to the first transistor; a second bit line, penetrating the memory cell array and electrically connected to the second transistor; a first word line, electrically connected to the first transistor; and a second word line, electrically connected to the second transistor.

17 Claims, 8 Drawing Sheets

(56) References Cited

U.S. PATENT DOCUMENTS

| | | | |
|---|---|---|---|
| 6,815,300 | B2 | 11/2004 | Jeong et al. |
| 8,309,416 | B2 | 11/2012 | Park et al. |
| 10,515,981 | B2 | 12/2019 | Or-Bach et al. |
| 11,201,213 | B2 | 12/2021 | Chen |
| 11,398,492 | B2 | 7/2022 | Yan et al. |
| 11,411,007 | B2 | 8/2022 | Lee et al. |
| 11,723,191 | B2 | 8/2023 | Choi et al. |
| 11,917,805 | B2 * | 2/2024 | Lee .................. H01L 27/0207 |
| 2003/0002359 | A1 | 1/2003 | Kieslich |
| 2003/0139011 | A1 | 7/2003 | Cleeves et al. |
| 2006/0240622 | A1 | 10/2006 | Lee et al. |
| 2007/0228427 | A1 | 10/2007 | Matsui et al. |
| 2012/0161229 | A1 | 6/2012 | Kwon et al. |
| 2012/0168848 | A1 | 7/2012 | Ahn |
| 2013/0052803 | A1 | 2/2013 | Roizin et al. |
| 2013/0264621 | A1 | 10/2013 | Nishi et al. |
| 2015/0228623 | A1 | 8/2015 | Oh et al. |
| 2020/0043941 | A1 | 2/2020 | Kim et al. |
| 2020/0083225 | A1 | 3/2020 | Ma et al. |
| 2020/0227416 | A1 | 7/2020 | Lilak et al. |
| 2020/0251151 | A1 | 8/2020 | Kang et al. |
| 2020/0266113 | A1 | 8/2020 | Tsugawa |
| 2020/0381450 | A1 | 12/2020 | Lue et al. |
| 2021/0020747 | A1 | 1/2021 | Chen |
| 2021/0151437 | A1 | 5/2021 | Tomishima |
| 2021/0159229 | A1 | 5/2021 | Gomes et al. |
| 2021/0375926 | A1 | 12/2021 | Mehandru et al. |
| 2022/0005809 | A1 | 1/2022 | Kim et al. |
| 2022/0028882 | A1 | 1/2022 | Lee |
| 2022/0085023 | A1 | 3/2022 | Shin et al. |
| 2022/0130856 | A1 | 4/2022 | Kim et al. |

FOREIGN PATENT DOCUMENTS

| | | | |
|---|---|---|---|
| CN | 102034759 | A | 4/2011 |
| CN | 102544016 | A | 7/2012 |
| CN | 107623033 | A | 1/2018 |
| CN | 108401468 | A | 8/2018 |
| CN | 108428703 | A | 8/2018 |
| CN | 110875315 | A | 3/2020 |
| CN | 110890371 | A | 3/2020 |
| CN | 112466881 | A | 3/2021 |
| CN | 112838088 | A | 5/2021 |
| CN | 113424319 | A | 9/2021 |
| CN | 113889473 | A | 1/2022 |
| CN | 113972213 | A | 1/2022 |
| CN | 114334980 | A | 4/2022 |
| CN | 114446963 | A | 5/2022 |
| CN | 114497055 | A | 5/2022 |
| EP | 3826058 | A1 | 5/2021 |
| JP | 2005252283 | A | 9/2005 |
| KR | 20090118299 | A | 11/2009 |
| KR | 1020190038223 | A | 4/2019 |
| KR | 1020220059424 | A | 5/2022 |
| TW | 200418168 | A | 9/2004 |
| TW | 201643994 | A | 12/2016 |
| TW | 202118058 | A | 5/2021 |
| TW | 202205539 | A | 2/2022 |
| TW | 202218129 | A | 5/2022 |
| WO | 2019204795 | A1 | 10/2019 |

OTHER PUBLICATIONS

European Patent Office, Extended European Search Report Issued in Application No. 22924572.5, Jul. 23, 2024, Germany, 8 pages.
European Patent Office, Extended European Search Report Issued in Application No. 22942970.9, Sep. 11, 2024, Germany, 10 pages.
Duan Xinlv et al: "Novel Vertical Channel-All-Around (CAA) IGZO FETs for 2T0C DRAM with High Density beyond 4F2 by Monolithic Stacking"; 2021 IEEE International Electron Devices Meeting (IEDM), Dec. 11, 2021.
International Search Report cited in PCT/CN2022/098247 mailed Dec. 19, 2022, 9 pages.
International Search Report cited in PCT/CN2022/098020 mailed Dec. 19, 2022, 9 pages.
International Search Report cited in PCT/CN2022/098018 mailed Dec. 28, 2022, 8 pages.
International Search Report cited in PCT/CN2022/098017 mailed Dec. 19, 2022, 9 pages.
International Search Report cited in PCT/CN2022/097528 mailed Dec. 16, 2022, 8 pages.
International Search Report cited in PCT/CN2022/098249 mailed Dec. 26, 2022, 9 pages.

* cited by examiner

A-A

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/098017, filed on Jun. 10, 2022, which claims the priority to Chinese Patent Application 202210610541.0, titled "SEMICONDUCTOR STRUCTURE AND MANUFACTURING METHOD THEREOF" and filed with the China National Intellectual Property Administration (CNIPA) on May 31, 2022. The entire contents of International Patent Application No. PCT/CN2022/098017 and Chinese Patent Application 202210610541.0 are incorporated herein by reference.

TECHNICAL FIELD

The present disclosure relates to the technical field of semiconductors, and in particular to a semiconductor structure and a manufacturing method thereof.

BACKGROUND

With the development of semiconductor technologies, the memory, especially a dynamic random access memory (DRAM) is widely used in various electronic devices due to its high storage density and fast reading and writing speed.

The DRAM usually includes a plurality of memory cells. Each memory cell includes a transistor and a capacitor. A gate of the transistor is electrically connected to a word line (WL) of the DRAM. The on and off of the transistor is controlled by the voltage on the word line. One of a source and a drain of the transistor is electrically connected to a bit line (BL), and the other is electrically connected to the capacitor. Data information is stored or outputted by the bit line.

In the foregoing memory, as the slenderness ratio of the capacitor increases, the difficulty of manufacturing the capacitor increases and the yield of the semiconductor structure decreases.

SUMMARY

According to some embodiments, a first aspect of the present disclosure provides a semiconductor structure. The semiconductor structure includes: a substrate; a memory cell array, located on the substrate, where the memory cell array includes a plurality of transistor units, each of the transistor units includes a first transistor and a second transistor extending along a first direction and electrically connected to each other, and the first direction is parallel to the substrate; a first bit line, penetrating the memory cell array and electrically connected to the first transistor; a second bit line, penetrating the memory cell array and electrically connected to the second transistor; a first word line, electrically connected to the first transistor; and a second word line, electrically connected to the second transistor.

According to some embodiments, a second aspect of the present disclosure provides a manufacturing method of a semiconductor structure, including:
providing a substrate; and
forming a memory cell array, first bit lines, second bit lines, first word lines, and second word lines on the substrate;
where the memory cell array includes a plurality of transistor units, each of the transistor units includes a first transistor and a second transistor extending along a first direction and electrically connected, and the first direction is parallel to the substrate; and
the first bit line penetrates the memory cell array and is electrically connected to the first transistor; the second bit line penetrates the memory cell array and is electrically connected to the second transistor; the first word line is electrically connected to the first transistor; and the second word line is electrically connected to the second transistor.

DETAILED DESCRIPTION

The problem of low yield of the semiconductor structure exists in the related technology. The inventors found that the reason is that as the aspect ratio of the capacitor increases, the capacitor tends to collapse during manufacturing, resulting in low yield of the semiconductor structure. In addition, a memory cell containing a capacitor and a transistor has a large size, which reduces the storage density of the semiconductor structure.

Accordingly, embodiments of the present disclosure provide a semiconductor structure and a manufacturing method thereof. In the semiconductor structure, a first transistor is electrically connected to a second transistor, and the first transistor and the second transistor both extend along a first direction that is parallel to a substrate, such that the first transistor and the second transistor are arranged in a horizontal direction relative to the substrate, which facilitates manufacturing of the first transistor and the second transistor and improves the yield of the semiconductor structure, and also increases the quantity of stacked first transistors and second transistors, thereby improving the storage capacity of the semiconductor structure. In addition, a 2T0C semiconductor structure is formed by one of the first transistor and the second transistor as a storage node, to reduce the area occupied by the memory cell, thereby improving the memory density of the semiconductor structure.

To make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the disclosure without creative efforts shall fall within the protection scope of the present disclosure.

According to a first aspect, the embodiments of the present disclosure provide a semiconductor structure. The semiconductor structure may be a memory device or a non-memory device. The memory device may include, for example, a dynamic random access memory (DRAM), a static random access memory (SRAM), a flash memory, an electrically erasable programmable read-only memory (EEPROM), a phase change random access memory (PRAM), or a magnetoresistive random access memory (MRAM). The non-memory device may be a logic device, e.g., a microprocessor, a digital signal processor, or a microcontroller, or a similar device. In the embodiments of the present disclosure, a DRAM is taken as an example for description.

Figure 1:
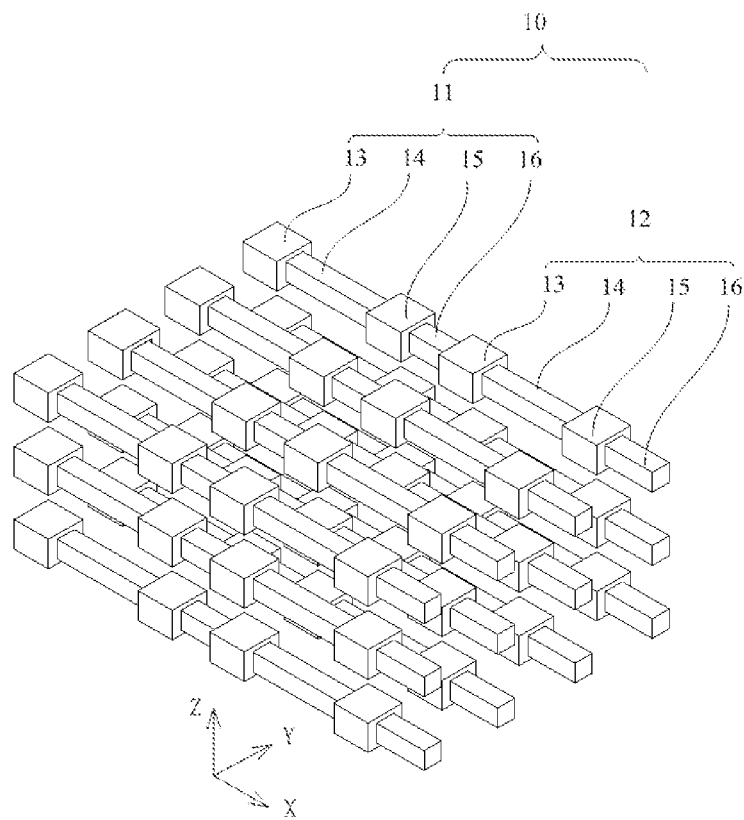
FIG. 1 is a schematic structural diagram of a memory cell array according to an embodiment of the present disclosure.

Referring to FIG. 1, the semiconductor structure includes: a substrate. The substrate is not shown in FIG. 1. The substrate can provide a support foundation for structure layers on the substrate, and may be made of a semiconductor structure. The semiconductor material may be one or more from the group consisting of silicon, germanium, silicon germanide, silicon carbide, silicon on insulator (SOI), or germanium on insulator (GOI).

The semiconductor structure further includes: a memory cell array. The memory cell array is provided on the substrate and configured to store data information. The memory cell array includes a plurality of transistor units 10. Each transistor unit 10 includes a first transistor 11 and a second transistor 12. The first transistor 11 and the second transistor 12 extend along a first direction, the first transistor 11 and the second transistor 12 are electrically connected along the first direction, and the first direction is parallel to the substrate.

In some possible examples, the plurality of transistor units 10 in the memory cell array may be arranged in an array. Specifically, the plurality of transistor units 10 are not only arranged at intervals along a second direction, but also arranged at intervals along a third direction. The plurality of transistor units 10 extend along the first direction. The second direction intersects the third direction; the first direction is perpendicular to the second direction, and the first direction is perpendicular to the third direction. In such an arrangement manner, the transistor units 10 in the memory cell array are more compact. The arrangement manner is optimized, which maximizes the quantity of transistor units 10 arranged in the memory cell array, thus improving the storage density of the semiconductor structure.

The first direction is parallel to the substrate 30, such that the first transistor 11 and the second transistor 12 are parallel to the substrate. Compared with the technical solution in which the transistor unit 10 is perpendicular to the substrate, this arrangement manner can reduce an etching depth of the transistor unit 10 and the etching difficulty of the semiconductor structure, and can also improve the stability of the transistor unit 10 and avoid collapsing of the transistor unit 10. On the other hand, this arrangement manner further helps increase the quantity of stacked transistor units 10, thus improving the storage capacity of the semiconductor structure.

The first direction, the second direction, and the third direction are perpendicular to each other. The first direction, which is direction X as shown in FIG. 1, is parallel to the substrate. The second direction is parallel to the substrate, a plane formed by the first direction and the second direction is parallel to the substrate. The second direction is direction Y as shown in FIG. 1. The third direction is perpendicular to the substrate, where the third direction is direction Z as shown in FIG. 1. Such a configuration facilitates manufacturing of the transistor unit 10, thus reducing the manufacturing difficulty of the semiconductor structure.

It may be understood that, the transistor unit 10 includes a first transistor 11 and a second transistor 12. By one of the first transistor 11 and the second transistor 12 as a storage node, it is unnecessary to provide a capacitor, such that the critical dimension of the memory cell array can be reduced. On the other hand, the arrangement of the memory cell array is optimized, which reduces the volume of the memory cell array, thus improving the storage density of the semiconductor structure.

Figure 2:
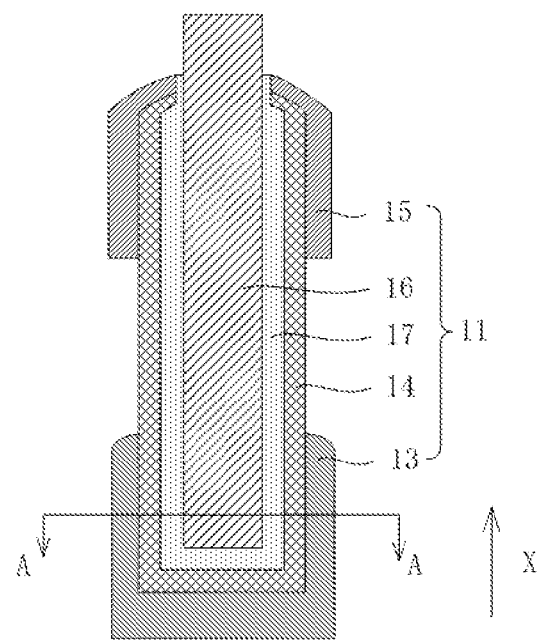
FIG. 2 is a schematic structural diagram of a first transistor according to an embodiment of the present disclosure.
Figure 3:
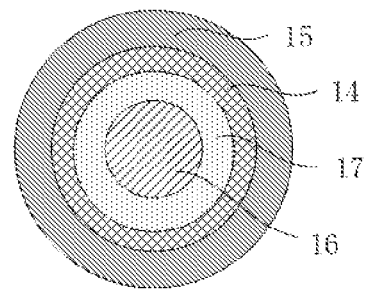
FIG. 3 is a schematic view of a cross section along A-A.

Referring to FIG. 2 and FIG. 3, in some possible embodiments, the first transistor 11 and the second transistor 12 each includes: a channel 14, in which an accommodation space is formed; a gate 16, provided with a first terminal and a second terminal that are opposite to each other along the first direction, where the first terminal of the gate 16 is located outside the accommodation space, and the second terminal of the gate 16 is located in the accommodation space; a dielectric layer 17, located between the gate 16 and the channel 14 and isolating the gate 16 from the channel 14 in an insulated manner; a drain 13, arranged at an end of the channel 14 that is away from the gate 16; and a source 15, arranged at the other side of the channel 14, where the source 15 and the drain 13 are spaced apart along the first direction. For ease of distinguishing, the gate of the first transistor 11 is defined as a first gate, and the gate of the second transistor 12 is defined as a second gate.

Specifically, the first transistor 11 includes a drain 13, a source 15, a gate 16, a channel 14, and a dielectric layer 17, where an accommodation space is formed in the channel 14. In some possible examples, the channel 14 includes a top wall, a bottom wall, and a sidewall that define the accommodation space. The top wall is provided with an opening, and the first terminal of the gate 16 is exposed outside the accommodation space via the opening. The channel 14 includes a top wall and a bottom wall that are opposite to each other along the first direction, and a sidewall located between the top wall and the bottom wall. One end of the sidewall is connected to the top wall, and the other end of the sidewall is connected to the bottom wall. The top wall, the bottom wall, and the sidewall define the accommodation space.

The channel 14 may be made of a semiconductor material. For example, the material of the channel 14 includes one from the group consisting of indium gallium zinc oxide (IGZO), polysilicon (polysilicon), monocrystalline silicon, silicon germanide (SiGe) and silicon carbide (SiC). The material of the channel 14 may be indium gallium zinc oxide. The indium gallium zinc oxide is transparent, such that the first transistor 11 can be used for manufacturing a transparent semiconductor device. Indium gallium zinc oxide can be prepared at a low temperature, such that the first transistor 11 can also be used for manufacturing a flexible semiconductor device. Indium gallium zinc oxide has high carrier mobility, which can improve the information transmission amount and sensitivity of the first transistor 11, thus reducing the power consumption of the first transistor 11. In addition, indium gallium zinc oxide has a high $I_{on}/I_{off}$ ratio and off-state current, which can reduce the gate-induced drain leakage (GIDL) of the first transistor 11, thus improving the performance of the first transistor 11.

The gate 16 may be in the shape of a pillar, which extends along the first direction. The first terminal and the second terminal of the gate 16 are opposite to each other along the first direction. For example, the first terminal of the gate 16 is a top end of the gate 16 (upper end shown in FIG. 2), and the second terminal of the gate 16 is a bottom end of the gate 16 (lower end shown in FIG. 2). The second terminal of the gate 16 is located in the accommodation space, and the first terminal of the gate 16 is located outside the accommodation space. In this way, a part of the gate 16 is located in the accommodation space, to control carriers in the channel 14; another part of the gate 16 is located outside the accommodation space, to be connected to a peripheral circuit. The gate 16 may be made of metal or alloy, for example, titanium (Ti), titanium nitride (TiN), tungsten (W), aluminum (Al), etc.

The dielectric layer 17 is arranged between the gate 16 and the channel 14, to electrically isolate the channel 14 from the gate 16. A channel-all-around transistor is formed to alleviate or even overcome the short-channel effect, thus improving the performance of the first transistor 11. In addition, the channel-all-around transistor can also overcome the floating body effect, to further improve the performance of the first transistor 11. The dielectric layer 17 may be made of silicon oxide ($SiO_2$), silicon nitride (SiN), silicon nitride (SiON), hafnium oxide ($HfO_2$), hafnium silicon oxide ($HfSiO_2$), lanthanum oxide (LaO), zirconium oxide ($ZrO_2$), zirconium silicon oxide ($ZrSiO_2$), tantalum oxide ($Ta_2O_5$), titanium oxide ($TiO_2$), barium strontium titanium oxide ($BaSrTiO_3$), barium titanium oxide ($BaTiO_3$), strontium titanium oxide ($SrTiO_3$), lithium oxide ($Li_2O$), aluminum oxide ($Al_2O_3$), lead scandium tantalum oxide (PbScTaO), lead zinc niobate ($PbZnNbO_3$), or a combination thereof.

The drain 13 is provided at one end of the channel 14, and the source 15 is provided at the other side of the channel 14. Moreover, the source 15 and the drain 13 are spaced apart along the first direction, to avoid contact between the source 15 and the drain 13, thereby ensuring normal operation of the first transistor 11. In some possible examples, one of the drain 13 and the source 15 covers the bottom wall of the channel 14 and a part of the sidewall close to the bottom wall; the other of the drain 13 and the source 15 covers the top wall of the channel 14 and a part of the sidewall close to the top wall. That is, the drain 13 and the source 15 covers two opposite ends of the channel 14 along the first direction respectively, to increase a contact area between the drain 13 and the channel 14 and a contact area between the source 15 and the channel 14, thereby improving the sensitivity of the first transistor 11 and the performance of the semiconductor structure. For example, the drain 13 is close to the second terminal of the gate 16, and the source is close to the first terminal of the gate 16.

The drain 13 and the source 15 may be made of a same material, which may be a metal material or a semiconductor material. For example, both the drain 13 and the source 15 may be made of molybdenum (Mo); or the materials of the drain 13 and the source 15 both include any one from the group consisting of monocrystalline silicon, polysilicon, amorphous silicon, a silicon-germanium compound, or silicon on insulator. Moreover, both the drain 13 and the source 15 may be doped with phosphorus or boron. The drain 13 and the source 15 may be made of a semiconductor material, which can overcome a Schottky barrier between the drain 13 and the channel 14 as well as a Schottky barrier between the source 15 and the channel 14. The reverse leakage current is reduced, thereby improving the performance of the first transistor 11.

It should be noted that, structures of the second transistor 12 and the first transistor 11 are the same. Therefore, for specific structures and structure arrangement of the second transistor 12, reference may be made to the specific structures and structure arrangement of the first transistor 11, and details are not described herein again.

Figure 4:
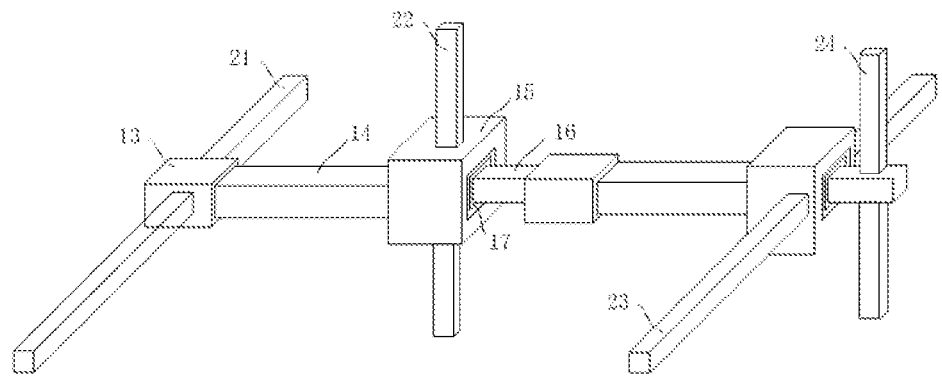
FIG. 4 is a schematic structural diagram of a transistor unit according to an embodiment of the present disclosure.
Figure 5:
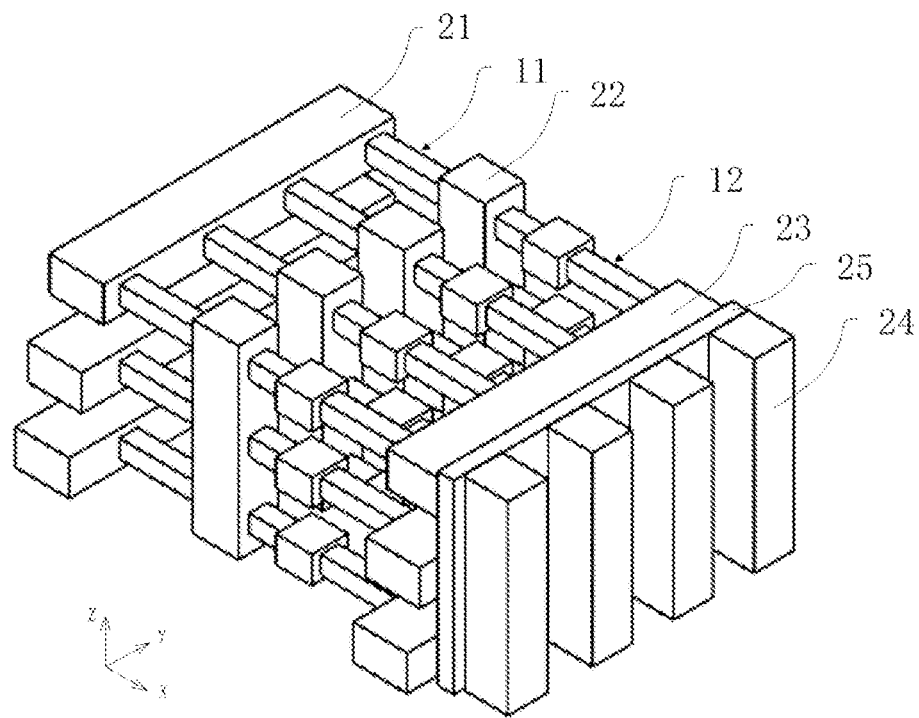
FIG. 5 is a schematic structural diagram of a semiconductor structure according to an embodiment of the present disclosure.

In addition, referring to FIG. 4 and FIG. 5, the semiconductor structure further includes: a first bit line 21, where the first bit line 21 penetrates the memory cell array and is electrically connected to the first transistor 11; a second bit line 23, where the second bit line 23 penetrates the memory cell array and is electrically connected to the second transistor 12; a first word line 22, where the first word line 22 is electrically connected to the first transistor 11; and a second word line 24, where the second word line 24 is electrically connected to the second transistor 12.

In some possible embodiments, a plurality of first bit lines 21, a plurality of first word lines 22, a plurality of second bit lines 23, and a plurality of second word lines 24 are provided. The plurality of first word lines 22 and the plurality of second word lines 24 all extend along the third direction and are electrically isolated; the plurality of first bit lines 21 and the plurality of second bit lines 23 all extend along the second direction and are electrically isolated; and/or, a first step is formed at an end of the plurality of first bit lines 21 that is away from the memory cell array, and a second step is formed at an end of the plurality of second bit lines 23 that is away from the memory cell array.

Specifically, as shown in FIG. 5, the plurality of first word lines 22 extend along the third direction (direction Z), and the first word lines 22 are arranged at intervals along the second direction (direction Y), such that the first word lines 22 are electrically isolated from each other. The plurality of second word lines 24 extend along the third direction, and the second word lines 24 are arranged at intervals along the second direction, such that the second word lines 24 are electrically isolated from each other. This arrangement manner can optimize the arrangement of the first word lines 22 and the second word lines 24, to reduce the occupied space, which helps increase the quantity of arranged first transistors 11 and second transistors 12, thereby improving the storage density of the semiconductor structure.

Each first word line 22 is electrically connected to a plurality of first transistors 11 that are located in a same column along the third direction; each second word line 24 is electrically connected to a plurality of second transistors 12 that are located in a same column along the third direction. Referring to FIG. 5, each first word line 22 extends along the third direction, and penetrates a plurality of first transistors 11 arranged along the third direction, so as to be electrically connected to the corresponding plurality of first transistors 11. Similarly, each second word line 24 extends along the third direction, and penetrates a plurality of second transistors 12 arranged along the third direction, so as to be electrically connected to the corresponding plurality of second transistors 12.

Specifically, as shown in FIG. 5, a plurality of first bit lines 21 extend along the second direction (direction Y), and the first bit lines 21 are arranged at intervals along the third direction (direction Z), such that the first bit lines 21 are electrically isolated from each other. A plurality of second bit lines 23 extend along the second direction, and the second bit line 23 are arranged at intervals along the third direction, such that the second bit lines 23 are electrically isolated from each other. This arrangement manner can optimize the arrangement of the first bit lines 21 and the second bit lines 23, to reduce the occupied space, which helps increase the quantity of arranged first transistors 11 and second transistors 12, thereby improving the storage density of the semiconductor structure.

Each first bit line 21 is electrically connected to a plurality of first transistors 11 that are located in a same row along the second direction; each second bit line 23 is electrically connected to a plurality of second transistors 12 that are located in a same row along the second direction. Referring to FIG. 5, each first bit line 21 extends along the second direction, and penetrates a plurality of first transistors 11 arranged along the second direction, so as to be electrically connected to the corresponding plurality of first transistors 11. Similarly, each second bit line 23 extends along the second direction, and penetrates a plurality of second transistors 12 arranged along the second direction, so as to be electrically connected to the corresponding plurality of second transistors 12.

Specifically, a first step is formed at an end of the plurality of first bit lines 21 that is away from the memory cell array, and a second step is formed at an end of the plurality of second bit lines 23 that is away from the memory cell array. The first step and the second step can lead out the plurality of first bit lines 21 and the plurality of second bit lines 23, so as to be electrically connected to a peripheral circuit.

In some possible implementations, along a direction of moving away from the substrate, lengths of the plurality of first bit line 21 decrease gradually, such that the first step is formed at an end of the plurality of first bit lines 21 that is away from the memory cell array. As shown in FIG. 5, the first step moves upwards along the second direction and moves upwards along the third direction. In this way, an end portion of each first bit line 21 is partially exposed, such that a corresponding first bit line plug is formed on each first bit line 21, to connect each first bit line 21 to the peripheral circuit.

Similarly, along a direction of moving away from the substrate, lengths of the plurality of second bit lines 23 decrease gradually, such that the second step is formed at an end of the plurality of second bit lines 23 that is away from the memory cell array. As shown in FIG. 5, the second step moves upwards along the second direction and moves upwards along the third direction. In this way, an end portion of each second bit line 23 is partially exposed, such that a corresponding second bit line plug is formed on each second bit line 23, to connect each second bit line 23 to the peripheral circuit.

The first step and the second step are arranged at a same side of the memory cell array. This arrangement manner can optimize the arrangement of the first bit lines 21 and the second bit lines 23, to reduce the space occupied by the first bit lines 21 and the second bit lines 23 along the second direction, which helps increase the quantity of arranged first transistors 11 and second transistors 12, thereby improving the storage density of the semiconductor structure. Certainly, the first step and the second step may be located at two sides of the memory cell array, which is not limited in the embodiments of the present disclosure.

In some possible embodiments, as shown in FIG. 4, the first bit line 21 is electrically connected to the drain 13 of the first transistor 11, and the first word line 22 is electrically connected to the source 15 of the first transistor 11; the second bit line 23 is electrically connected to the source 15 of the second transistor 12, and the second word line 24 is electrically connected to the gate 16 of the second transistor 12; the gate 16 of the first transistor 11 is electrically connected to the drain 13 of the second transistor 12. With such connections, the first transistor 11 can be used as a memory cell, and the memory cell array forms a 2T0C array, to help improve the storage capacity of the semiconductor structure. Alternatively, the first bit line 21 is electrically connected to the source 15 of the first transistor 11, and the first word line 22 is electrically connected to the drain 13 of the first transistor 11; the first bit line 21 is electrically connected to the drain 13 of the second transistor 12, and the first word line 22 is electrically connected to the gate 16 of the second transistor 12; the gate 16 of the first transistor 11 is electrically connected to the source 15 of the second transistor 12. In other words, the source 15 and the drain 13 of the first transistor 11 are interchangeable, and the source 15 and the drain 13 of the second transistor 12 are also interchangeable. The embodiments of the present disclosure do not limit the positions of the sources 15 and drains 13 of the first transistor 11 and the second transistor 12.

Figure 6:
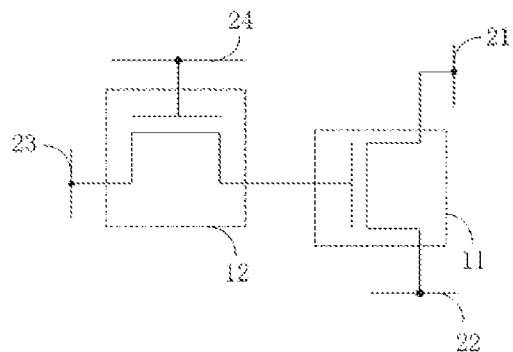
FIG. 6 is a diagram of a circuit principle of a transistor unit according to an embodiment of the present disclosure.

Specifically, referring to FIG. 6, the first bit line 21 is a read bit line (RBL), the second bit line 23 is a write bit line (WBL), the first word line 22 is a read word line (RWL), and the second word line 24 is a write word line (WWL).

In some possible embodiments, along the first direction, a first isolation layer 25 is further arranged between the second bit line 23 and the second word line 24, to isolate the second bit line 23 from the second word line 24 in an insulated manner, where the second transistor 12 penetrates the first isolation layer 25. Such a configuration can prevent electrical connection between the second bit line 23 and the second word line 24, to improve the yield of the semiconductor structure. A material of the first isolation layer may include silicon nitride or silicon oxynitride, but is not limited thereto.

In some possible embodiments, the semiconductor structure further includes a first bit line plug, a second bit line plug, a first word line plug, and a second word line plug that extends along the third direction. The first bit line plug is electrically connected to the first bit line 21, the second bit line plug is electrically connected to the second bit line 23, the first word line plug is electrically connected to the first word line 22, and the second word line plug is electrically connected to the second word line 24.

Specifically, a plurality of first bit line plugs are provided. The plurality of first bit line plugs extend along the third direction and are arranged at intervals. Each first bit line plug is electrically connected to one first bit line 21. For example, the first bit line plug is in contact with a surface of the first bit line 21 that is away from the substrate. Lengths of the first bit line plugs may change in a stepped manner, such that surfaces of the first bit line plugs that are away from the substrate are flush with each other, so as to form a connection layer on the first bit line plugs to lead out the first bit line plugs.

A plurality of second bit line plugs are provided. The plurality of second bit line plugs extend along the third direction and are arranged at intervals. Each second bit line plug is electrically connected to one second bit line 23. For example, the second bit line plug is in contact with a surface of the second bit line 23 that is away from the substrate. Lengths of the second bit line plugs may change in a stepped manner, such that surfaces of the second bit line plugs that are away from the substrate are flush with each other, so as to form a connection layer on the second bit line plugs to lead out the second bit line plugs.

A plurality of first word line plugs are provided. The plurality of first word line plugs extend along the third direction and are arranged at intervals. Each first word line plug is electrically connected to one first word line 22. Lengths of the first word line plugs may be the same, to facilitate manufacturing of the first word line plugs. A plurality of second word line plugs are provided. The plurality of second word line plugs extend along the third direction and are arranged at intervals. Each second word line plug is electrically connected to one second word line 24. Lengths of the second word line plugs may be the same, to facilitate manufacturing of the second word line plugs.

In conclusion, in the semiconductor structure provided by the embodiments of the present disclosure, the first transistor 11 is electrically connected to the second transistor 12, and the first transistor 11 and the second transistor 12 both extend along the first direction that is parallel to the substrate, such that the first transistor 11 and the second transistor 12 are arranged in a horizontal direction relative to the substrate, which facilitates manufacturing of the first transistor 11 and the second transistor 12 and improves the yield of the semiconductor structure, and also increases the quantity of stacked first transistors 11 and second transistors 12, thereby improving the storage capacity of the semiconductor structure. In addition, a 2T0C semiconductor structure is formed by one of the first transistor 11 and the second transistor 12 as a storage node, to reduce the area occupied by the memory cell, thereby improving the storage density of the semiconductor structure.

Figure 7:
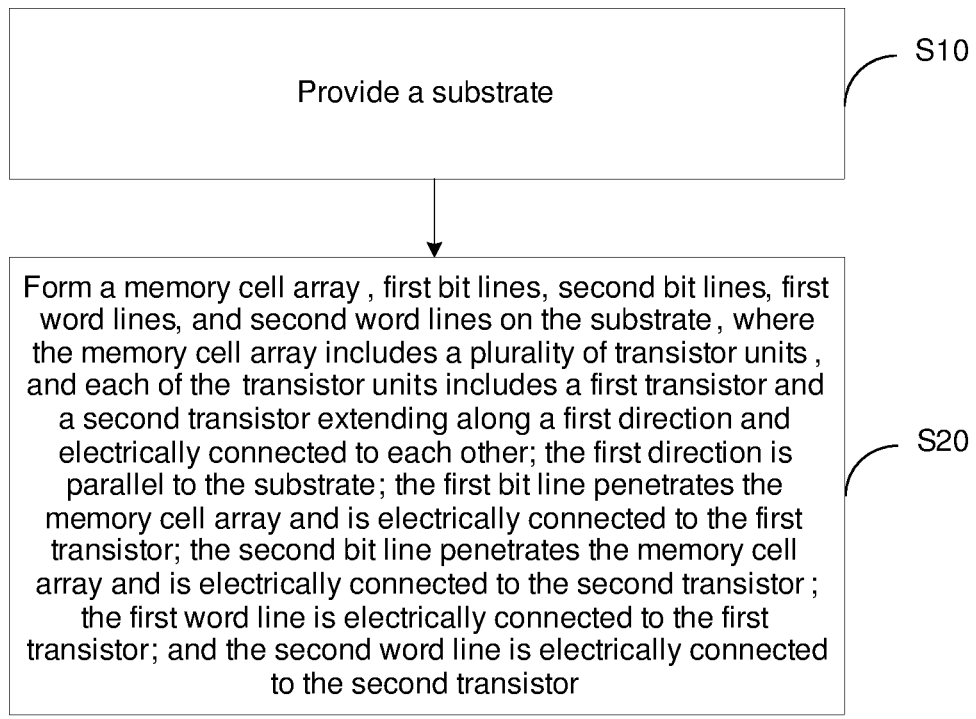
FIG. 7 is a flowchart of a manufacturing method of a semiconductor structure according to an embodiment of the present disclosure.
Figure 8:
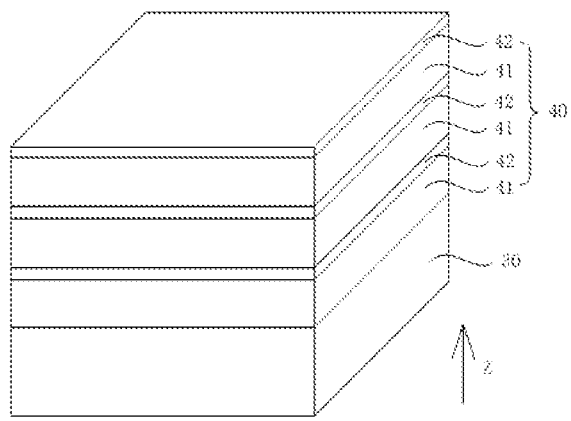
FIG. 8 is a schematic structural diagram of a first laminated structure according to an embodiment of the present disclosure.

According to a second aspect, the embodiments of the present disclosure further a manufacturing method of a semiconductor structure. The manufacturing method of a semiconductor structure can be used to manufacture the foregoing semiconductor structure. As shown in FIG. 7, the manufacturing method of a semiconductor structure includes the following steps:

Step S10: Provide a substrate. Referring to FIG. 8, the substrate 30 may provide a support foundation for structure layers on the substrate 30, and may be made of a semiconductor material. The semiconductor material may be one or more from the group consisting of silicon, germanium, silicon germanide, silicon carbide, silicon on insulator, or germanium on insulator.

Step S20: Form a memory cell array, first bit lines, second bit lines, first word lines, and second word lines on the substrate, where the memory cell array includes a plurality of transistor units, and each transistor unit includes a first transistor and a second transistor extending along a first direction and electrically connected to each other; the first direction is parallel to the substrate; the first bit line penetrates the memory cell array and is electrically connected to the first transistor; the second bit line penetrates the memory cell array and is electrically connected to the second transistor; the first word line is electrically connected to the first transistor; and the second word line is electrically connected to the second transistor.

Specifically, referring to FIG. 1 and FIG. 5, the memory cell array is provided on the substrate and configured to store data information. The memory cell array includes a plurality of transistor units 10. Each transistor unit 10 includes a first transistor 11 and a second transistor 12. The first transistor 11 and the second transistor 12 extend along a first direction, the first transistor 11 and the second transistor 12 are electrically connected along the first direction, and the first direction is parallel to the substrate.

In some possible examples, the plurality of transistor units 10 in the memory cell array may be arranged in an array. Specifically, the plurality of transistor units 10 are not only arranged at intervals along a second direction, but also arranged at intervals along a third direction. The plurality of transistor units 10 extend along the first direction. The second direction intersects the third direction; the first direction is perpendicular to the second direction, and the first direction is perpendicular to the third direction. In such an arrangement manner, the transistor units 10 in the memory cell array are more compact. The arrangement manner is optimized, which maximizes the quantity of transistor units 10 arranged in the memory cell array, thus improving the storage density of the semiconductor structure.

The first direction is parallel to the substrate 30, such that the first transistor 11 and the second transistor 12 are parallel to the substrate. Compared with the technical solution in which the transistor unit 10 is perpendicular to the substrate, this arrangement manner can reduce an etching depth of the transistor unit 10 and the etching difficulty of the semiconductor structure, and can also improve the stability of the transistor unit 10 and avoid collapsing of the transistor unit 10. On the other hand, this arrangement manner further helps increase the quantity of stacked transistor units 10, thus improving the storage capacity of the semiconductor structure.

The first direction, the second direction, and the third direction are perpendicular to each other. The first direction, which is direction X as shown in FIG. 1, is parallel to the substrate. The second direction is parallel to the substrate, a plane formed by the first direction and the second direction is parallel to the substrate. The second direction is direction Y as shown in FIG. 1. The third direction is perpendicular to the substrate, where the third direction is direction Z as shown in FIG. 1. Such a configuration facilitates manufacturing of the transistor unit 10, thus reducing the manufacturing difficulty of the semiconductor structure.

Specifically, the transistor unit 10 includes a first transistor 11 and a second transistor 12. By one of the first transistor 11 and the second transistor 12 as node, it is unnecessary to provide a capacitor as in the related art, such that the critical dimension of the memory cell array can be reduced. On the other hand, the arrangement of the memory cell array is optimized, which reduces the volume of the memory cell array, thus improving the storage density of the semiconductor structure.

Referring to FIG. 2 and FIG. 3, the first transistor 11 and the second transistor 12 each includes: a channel 14, in which an accommodation space is formed; a gate 16, provided with a first terminal and a second terminal that are opposite to each other along the first direction, where the first terminal of the gate 16 is located outside the accommodation space, and the second terminal of the gate 16 is located in the accommodation space; a dielectric layer 17, located between the gate 16 and the channel 14 and isolating the gate 16 from the channel 14 in an insulated manner; a drain 13, arranged at an end of the channel 14; and a source 15, arranged at the other side of the channel 14, where the source 15 and the drain 13 are spaced apart along the first direction.

The first bit line 21 penetrates the memory cell array and is electrically connected to the first transistor 11; the second bit line 23 penetrates the memory cell array and is electrically connected to the second transistor 12; the first word line 22 is electrically connected to the first transistor 11; and the second word line 24 is electrically connected to the second transistor 12.

Each first word line 22 is electrically connected to a plurality of first transistors 11 that are located in a same column along the third direction; each second word line 24 is electrically connected to a plurality of second transistors 12 that are located in a same column along the third direction. Each first bit line 21 is electrically connected to a plurality of first transistors 11 that are located in a same row along the second direction; each second bit line 23 is electrically connected to a plurality of second transistors 12 that are located in a same row along the second direction.

Specifically, the first bit line 21 is electrically connected to the source 15 of the first transistor 11, and the first word line 22 is electrically connected to the drain 13 of the first transistor 11; the first bit line 21 is electrically connected to the drain 13 of the second transistor 12, and the first word line 22 is electrically connected to the gate 16 of the second transistor 12; the gate 16 of the first transistor 11 is electrically connected to the drain of the second transistor 12. With such connections, the first transistor 11 can be used as a memory cell, and the memory cell array forms a 2T0C array, to help improve the storage capacity of the semiconductor structure.

In some possible implementations, the forming a memory cell array, first bit lines, second bit lines, first word lines, and second word lines 24 on the substrate (step S20) includes:

Step S21: Form a first gate array and a second gate array that are arranged at an interval along the first direction on the substrate, where the first gate array includes a plurality of first gates that are arranged at intervals along a second direction and arranged at intervals along a third direction, and the second gate array includes a plurality of second gates that are arranged at intervals along the second direction and arranged at intervals along the third direction.

Figure 11:
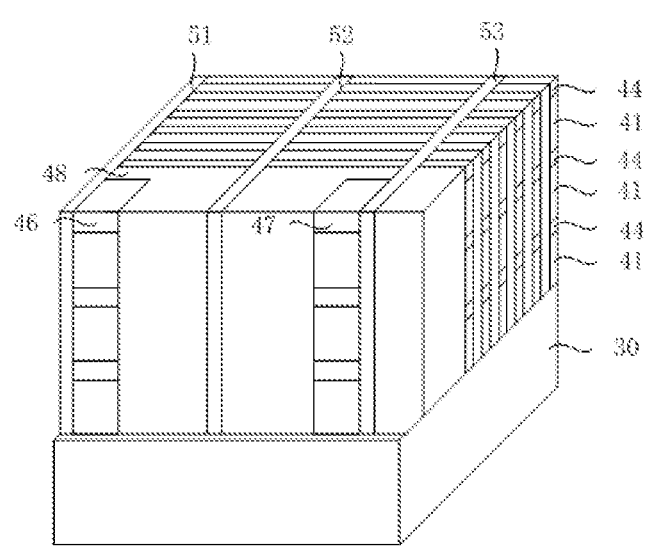
FIG. 11 is a schematic structural diagram after formation of a first support layer, a second support layer, and a third support layer according to an embodiment of the present disclosure.
Figure 12:
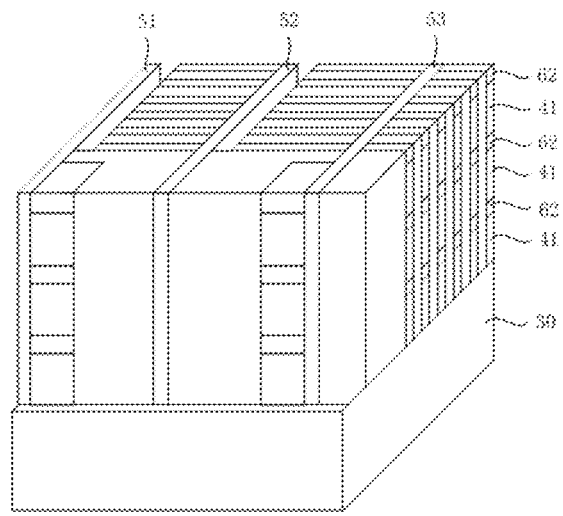
FIG. 12 is a schematic structural diagram after removal of a part of a first sacrificial layer, a part of a second sacrificial layer, and a part of an initial gate layer according to an embodiment of the present disclosure.
Figure 13:
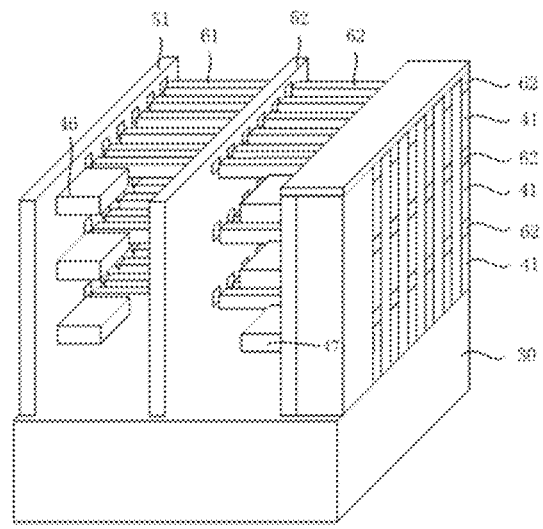
FIG. 13 is a schematic structural diagram after removal of a first sacrificial layer according to an embodiment of the present disclosure.

Referring to FIG. 8 to FIG. 13, the first gate array and the second gate array are arranged at an interval along the first direction, such that other structures are formed in the first gate array and the second gate array conveniently. The first gate array includes a plurality of first gates 61 (as shown in FIG. 13), and the plurality of first gates 61 are arranged at intervals along a second direction and arranged at intervals along a third direction. The second gate array includes a plurality of second gates 62 (as shown in FIG. 13), and the plurality of second gates 62 are arranged at intervals along the second direction and arranged at intervals along the third direction. The plurality of first gates 61 and the plurality of second gates 62 are extend along the first direction, and correspond to each other in a one-to-one manner. It may be understood that, the extension direction of the first gate 61 is the extension direction of the first gate array, and the extension direction of the second gate 62 is the extension direction of the second gate array. The first gate array and the second gate array both extend along the first direction, and are arranged at an interval along the first direction.

An orthographic projection of the first gate 61 along the first direction has an overlapping region with orthographic projection of the corresponding second gate 62 along the first direction, to facilitate connection between the first transistor 11 subsequently formed by the first gate 61 and the second transistor 12 subsequently formed by the second gate 62 to form a transistor unit 10, such that one of the first transistor 11 and the second transistor 12 is used as a storage node to implement a 2T0C structure. It may be understood that, the first gate 61 is the gate 16 of the first transistor 11, and the second gate 62 is the gate 16 of the second transistor.

A central line of the first gate 61 coincides with a central line of the corresponding second gate 62. In this way, a relative large contact area exists between the first transistor 11 subsequently formed by the first gate 61 and the second transistor 12 subsequently formed by the second gate 62, to improve the electrical performance of the transistor unit 10.

In a possible implementation manner, the step of forming a first gate array and a second gate array that are arranged at an interval along the first direction on the substrate (step S21) specifically includes the following steps:

Step S21-1: Form a first laminated structure on the substrate, where the first laminated structure has a first region and a second region, and the first laminated structure includes first sacrificial layers and initial gate layers that are arranged alternately along the third direction.

The first region is configured to form the first transistor and the second transistor, and the second region is configured to form a first connection layer 46 and a second connection layer 47. The first connection layer 46 and the second connection layer 47 are configured to provide support during forming of the first bit line and the second bit line, to facilitate forming of the first bit line and the second bit line.

Specifically, referring to FIG. 8, the first laminated structure 40 includes a plurality of first sacrificial layers 41 and a plurality of initial gate layers 42, where the plurality of first sacrificial layers 41 and the plurality of initial gate layers 42 are arranged alternately along the third direction. An innermost layer of the first laminated structure 40 that is close to the substrate 30 is the first sacrificial layer 41, and an outermost layer of the first laminated structure 40 that is away from the substrate 30 is the initial gate layer 42. In such an arrangement, the innermost layer of the first laminated structure 40 is the first sacrificial layer 41, where the first sacrificial layer 41 can electrically isolate the substrate from the initial gate layer 42, to increase the quantity of subsequently formed first transistors and second transistors. The innermost layer of the first laminated structure 40 is the initial gate layer 42, which can reduce the height of the first laminated structure 40 and improve the storage density of the semiconductor structure. A material of the first sacrificial layer 41 may be silicon oxide, and a material of the initial gate layer 42 may be polysilicon.

Specifically, the plurality of first sacrificial layers 41 and the plurality of initial gate layers 42 may be formed through a deposition process. The deposition process may include chemical vapor deposition (CVD), physical vapor deposition (PVD), or atomic layer deposition (ALD).

Step S21-2: Remove a part of the first laminated structure, to form a first trench that extends along the first direction in the first region, and form a second trench that extends along the second direction in the second region, where the first trench partitions the initial gate layers in the first region into a plurality of initial gate pillars, and the second trench partitions the initial gate layers in the second region into a first connection layer and a second connection layer.

Figure 9:
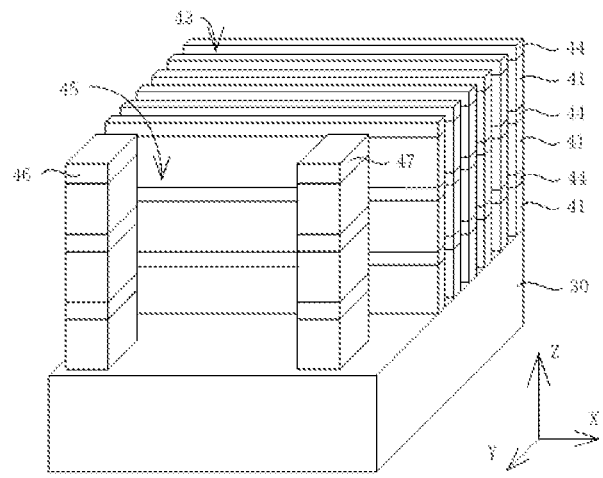
FIG. 9 is a schematic diagram after formation of a first trench and a second trench according to an embodiment of the present disclosure.

Referring to FIG. 8 and FIG. 9, dry etching or wet etching is performed on the first laminated structure 40, to form a first trench 43 in the first region and form a second trench 45 in the second region. The first trench 43 extends along the first direction. A plurality of first trenches 43 may be provided. The plurality of first trenches 43 are arranged at intervals along the second direction, to partition the first laminated structure 40 of the first region into a plurality of parts, such that the initial gate layers 42 form a plurality of initial gate pillars 44 arranged in an array. Along the second direction, the plurality of initial gate pillars 44 are separated by the first trenches 43; along the third direction, the plurality of initial gate pillars 44 are separated by the first sacrificial layers 41, and the plurality of initial gate pillars 44 all extend along the third direction.

The second trench 45 extends along the second direction. The second trench 45 partitions the initial gate layer 42 in the second region into a first connection layer 46 and a second connection layer 47. The first connection layer 46 and the second connection layer 47 are located at two ends of the initial gate pillar 44 along the first direction. As shown in FIG. 9, the first connection layer 46 and the second connection layer 47 are located at a left end and a right end of the initial gate pillar 44. Each initial gate pillar 44 corresponds to one first connection layer 46 and one second connection layer 47, and the corresponding initial gate pillar 44, first connection layer 46, and second connection layer 47 are arranged in a same layer.

In this way, the initial gate layer 42 located in the first region and the initial gate layer 42 located in the second region can be etched at the same time, such that required structures are formed on the first region and the second region at the same time, thus reducing manufacturing steps of the semiconductor structure. In addition, the first connection layer 46 and the second connection layer 47 can provide support, to facilitate subsequent manufacturing of the first bit line and the second bit line.

Step S21-3: Separate the plurality of initial gate pillars into the first gate array and the second gate array along the first direction.

Referring to FIG. 12, the plurality of initial gate pillars 44 are etched, to break each initial gate pillar 44 along the first direction, thereby forming the first gate array and the second gate array. It may be understood that, along the third direction, the first sacrificial layer 41 still exists between two adjacent initial gate pillars 44, and the first sacrificial layers 41 will also be etched while the plurality of initial gate pillars 44 are etched.

Referring to FIG. 11 and FIG. 13, with the orientation shown in FIG. 13 as an example, the plurality of initial gate pillars 44 on the left side form the first gate array, where each initial gate pillar 44 forms one first gate 61; the plurality of initial gate pillars 44 on the right side form the second gate array, where each initial gate pillar 44 forms one second gate 62. By breaking an integrated initial gate pillar 44 into a first gate 61 and a second gate 62, it can perfectly ensure that the first gate 61 is aligned with the second gate 62, and the manufacturing process is simple.

Figure 10:
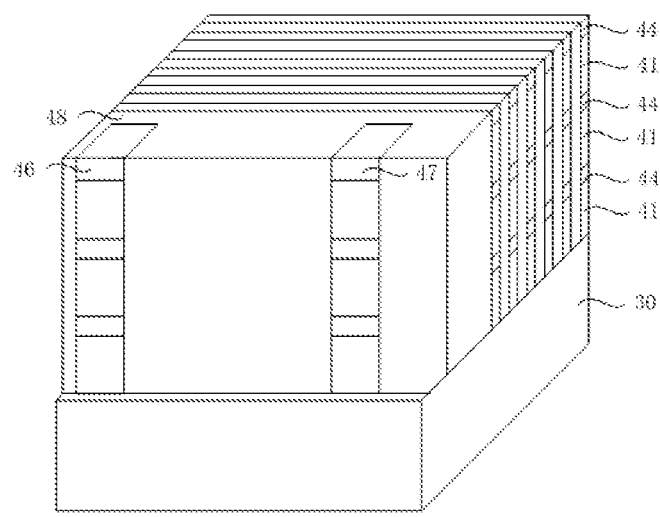
FIG. 10 is a schematic structural diagram after formation of a second sacrificial layer according to an embodiment of the present disclosure.

In a possible implementation manner, the separating the initial gate layers located in the first region into the first gate array and the second gate array along the first direction (step S21-3) includes:

forming a second sacrificial layer 48 in the first trench 43 and the second trench 45. Referring to FIG. 9 and FIG. 10, the second sacrificial layer 48 fills the first trench 43 and the second trench 45, such that the first trench 43 and the second trench 45 can be filled up. A surface of the second sacrificial layer 48 that is away from the substrate 30 may be flush with a surface of the first laminated structure that is away from the substrate 30, to form a relatively flat surface, such that other structure layers can be manufactured thereon conveniently.

After the second sacrificial layer 48 is formed, a first support layer 51, a second support layer 52, and a third support layer 53 that are arranged at intervals along the first direction are formed in the second sacrificial layer 48 and the first laminated structure 40. The first support layer 51 connects the initial gate pillar 44 and the first connection layer 46, the third support layer 53 connects the initial gate pillar 44 and the second connection layer 47, and the second support layer 52 connects the initial gate pillars 44.

Specifically, referring to FIG. 9 and FIG. 11, the second sacrificial layer 48, the first sacrificial layers 41, and the initial gate pillars 44 are etched, to form filling trenches in the second sacrificial layer 48 and the first laminated structure 40; then a support material is deposited in the filling trenches, and the deposited material is etched back, to form the first support layer 51, the second support layer 52, and the third support layer 53. The first support layer 51, the second support layer 52, and the third support layer 53 are arranged along the first direction, and the second support layer 52 is located between the first support layer 51 and the third support layer 53. The first support layer 51 connects the initial gate pillar 44 and the first connection layer 46, and mainly supports the first connection layer 46 subsequently; the third support layer 53 connects the initial gate pillar 44 and the second connection layer 47, and mainly supports the initial gate pillar 44 and the second connection layer 47 subsequently; the second support layer 52 connects the initial gate pillars 44, and mainly supports the initial gate pillar 44 subsequently.

In a specific example, the first support layer 51 is located at first ends of the initial gate pillar 44 and the first connection layer 46, and covers the first ends of the initial gate pillar 44 and the first connection layer 46 as well as side surfaces close to the first ends. The second support layer 52 is located in the middle of each initial gate pillar 44, covers side surfaces at the middle of the initial gate pillar 44, and is not in contact with the first connection layer 46 or the second connection layer 47. The third support layer 53 is located at a second end of the second connection layer 47. The third support layer 53 covers the second end of the second connection layer 47 as well as a side surface close to the second end, and covers a side surface of the initial gate pillar 44 that is close to the second end. In other words, along the first direction, the second connection layer 47 extends into the third support layer 53, and the initial gate pillar 44 penetrates the third support layer 53, to facilitate manufacturing of the second word line at the second end of the initial gate pillar 44.

After the first support layer 51, the second support layer 52, and the third support layer 53 are formed, the second sacrificial layer 48, the first sacrificial layer 41, and the initial gate pillar 44 at lateral sides of the second support layer 52 in the first region are removed, to form the first gate array and the second gate array. Referring to FIG. 12, a part of the second sacrificial layer 48, a part of the first sacrificial layer 41, and a part of the initial gate pillar 44 at lateral sides of the second support layer 52 are removed, to form a partition trench, which exposes the substrate 30, to ensure that each initial gate pillar 44 is broken. Referring to FIG. 11 and FIG. 13, each broken initial gate pillar 44 is divided into a first gate 61 and a second gate 62 that correspond to each other along the first direction. End surfaces, which are close to each other, of the first gate 61 and the second gate 62 are aligned with each other; the plurality of first gates 61 form the first gate array, and the plurality of second gates 62 form the second gate array.

In some possible examples, while the second sacrificial layer 48, the first sacrificial layer 41, and the initial gate pillar 44 at lateral sides of the second support layer 52 in the first region are removed, the second sacrificial layer 48, the first sacrificial layer 41, and the initial gate pillar 44 at lateral sides of the first support layer 51 in the first region may also be removed That is, the second sacrificial layer 48, the first sacrificial layer 41, and the initial gate pillar 44 at lateral sides of the first support layer 51 and the second support layer 52 in the first region are removed, such that end portions of the first gate array and the second gate array are exposed, to facilitate forming of other structures thereon, for example, the channel 14, to ensure that the channel 14 can cover one terminal of the first gate 61 and the second gate 62, thereby reducing the leakage current of the first gate 61 and the second gate 62.

After the first gate array and the second gate array are formed, referring to FIG. 12 and FIG. 13, the remaining second sacrificial layer 48 and first sacrificial layer 41 are removed. The remaining first sacrificial layer 41 and second sacrificial layer 48 are removed through etching, such that the first gate array and the second gate array are exposed, to facilitate forming of channels 14 on the first gate array and the second gate array. The first terminal of each first gate 61 in the first gate array is covered by the second support layer 52, and the channel 14 will not be formed at the first terminal subsequently, ensuring that the first terminal of the first gate 61 extends to the outside of the channel 14. The first terminal of each second gate 62 in the second gate array also needs to extend to the outside of the channel 14. Therefore, before subsequent manufacturing, a protective layer is first formed on the first terminal of each second gate 62, where the protective layer covers the first terminal of each second gate 62.

In other possible implementations, referring to FIG. 13, after the first gate array and the second gate array are formed, the second sacrificial layer 48 and the first sacrificial layer 41 located between the first support layer 51 and the third support layer 53 are removed. In this way, the remaining second sacrificial layer 48 and first sacrificial layer 41 cover the first terminal of each second gate 62 in the second gate array, and it is unnecessary to manufacture a protective layer separately.

Step S22: Form a dielectric layer on the first gate and the second gate, and form a channel on the dielectric layer, where first terminals of the first gate and the second gate both extend to outsides of the corresponding channels.

Figure 14:
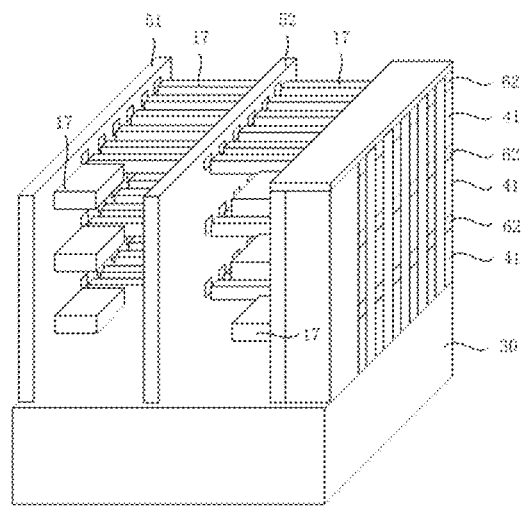
FIG. 14 is a schematic structural diagram after formation of a dielectric layer according to an embodiment of the present disclosure.
Figure 15:
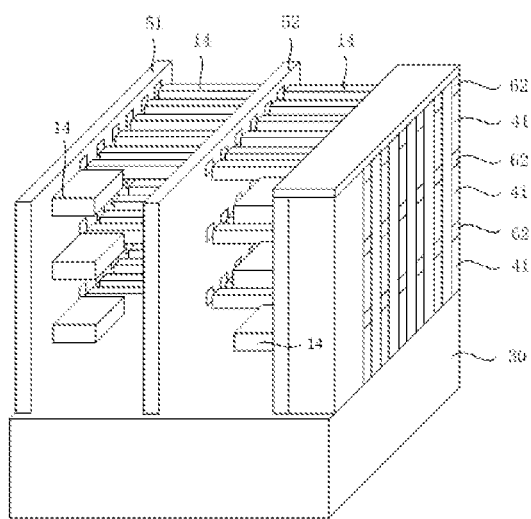
FIG. 15 is a schematic structural diagram after formation of a channel according to an embodiment of the present disclosure.

Referring to FIG. 13 and FIG. 14, the dielectric layers 17 are formed on the first gate 61 and the second gate 62 respectively, where the dielectric layers 17 cover exposed surfaces of the first gate 61 and the second gate 62. Referring to FIG. 14 and FIG. 15, the channel 14 is deposited on the dielectric layer 17, where the channel 14 covers the surface of the dielectric layer 17. The first terminal of the first gate 61 (the right terminal shown in FIG. 15) and the first terminal of the second gate 62 (the right terminal shown in FIG. 15) both extend to outsides of the corresponding channels 14.

In the embodiment in which the first connection layer 46 and the second connection layer 47 are formed in the second region, the forming a dielectric layer 17 on each of the first gate 61 and the second gate 62 and forming a channel 14 on the dielectric layer 17 includes: forming dielectric layers 17 on the first gate 61, the second gate 62, the first connection layer 46, and the second connection layer 47 respectively.

In this way, it is unnecessary to provide a mask in the second region, which facilitates manufacturing of the dielectric layer 17. In addition, as shown in FIG. 13, the first connection layer 46 corresponds to the first gate 61, and the second connection layer 47 corresponds to the second gate 62; the corresponding first gate 61 and first connection layer 46 are arranged in the same layer, and the corresponding second gate 62 and second connection layer 47 are arranged in the same layer. The dielectric layers 17 are formed on the first gate 61, the second gate 62, the first connection layer 46, and the second connection layer 47 respectively, and the channel 14 is formed on each dielectric layer 17, which can ensure the consistency of the first gate 61 and the corresponding first connection layer 46, and the consistency of the second gate 62 and the corresponding second connection layer 47, such that the flat first bit line and second bit line can be formed thereon.

Step S23: Form a first metal layer and a second metal layer, where the first metal layer covers the channel located at a second terminal of the first gate, the second metal layer covers the channel close to the first terminal of the second gate, and the second terminal and the first terminal are opposite to each other along the first direction.

Referring to FIG. 15 to FIG. 18, the first metal layer 81 covers the channel 14 at the second terminal of the first gate 61, and covers an end surface of the channel 14 as well as the lateral periphery close to the end surface. The first metal layer 81 forms the drain 13 or the source 15 of the first transistor 11. The second metal layer 82 covers the channel 14 close to the first terminal of the second gate 62 as well as a lateral periphery of the channel 14. The second metal layer 82 forms the drain 13 or the source 15 of the second transistor 12. Along the first direction, the first terminal of the first gate 61 is opposite to the second terminal of the first gate 61, and the first terminal of the second gate 62 is opposite to the second terminal of the second gate 62.

In some possible implementations, the forming a first metal layer 81 and a second metal layer 82 (step S23) includes the following steps:

Step S23-1: Form a second isolation layer between the first support layer and the second support layer, and form a third isolation layer between the second support layer and the third support layer.

Figure 16:
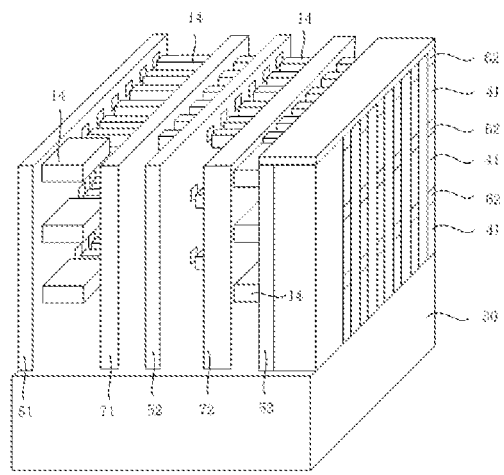
FIG. 16 is a schematic structural diagram after formation of a second isolation layer and a third isolation layer according to an embodiment of the present disclosure.

Referring to FIG. 13, FIG. 15 and FIG. 16, the second isolation layer 71 is arranged between the first support layer 51 and the second support layer 52, and the third isolation layer 72 is arranged between the second support layer 52 and the third support layer 53. As shown in FIG. 16, along the first direction, the first support layer 51, the second isolation layer 71, the second support layer 52, the third isolation layer 72, and the third support layer 53 are arranged at intervals sequentially. The first connection layer 46 is located between the first support layer 51 and the second isolation layer 71, and the second connection layer 47 is located between the third isolation layer 72 and the third support layer 53.

The second isolation layer 71 partitions the channel 14 located between the first support layer 51 and the second support layer 52 into two parts, where the drain 13 of the first transistor 11 is formed on a part of the channel 14, and the source 15 of the first transistor 11 is formed on the other part of the channel 14. The third isolation layer 72 partitions the channel 14 located between the second support layer 52 and the third support layer 53 into two parts, where the drain 13 of the second transistor 12 is formed on a part of the channel 14, and the source 15 of the second transistor 12 is formed on the other part of the channel 14.

Step S23-2: Form a third sacrificial layer between the second isolation layer and the second support layer, and between the second support layer and the third isolation layer.

Figure 17:
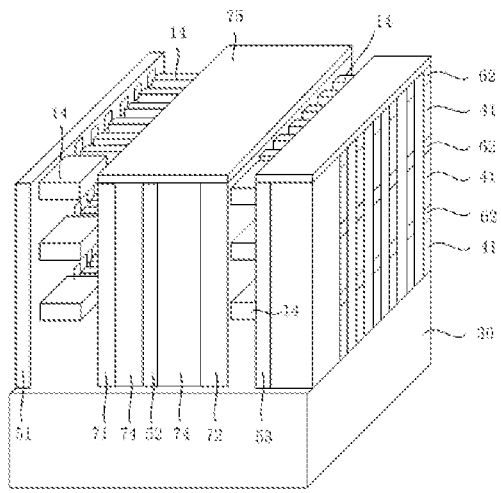
FIG. 17 is a schematic structural diagram after formation of a third sacrificial layer according to an embodiment of the present disclosure.

Referring to FIG. 16 and FIG. 17, the third sacrificial layer 74 fills a space between the second isolation layer 71 and the second support layer 52, and fills a space between the second support layer 52 and the third isolation layer 72. After the third sacrificial layer 74 is formed, the channels 14 on the first connection layer 46 and the second connection layer 47 are exposed.

In some possible examples, after the third sacrificial layer 74 is formed, a first barrier layer 75 is further formed on the third sacrificial layer 74, and the first barrier layer 75 further covers the second isolation layer 71, the second support layer 52, and the third isolation layer 72. The first barrier layer 75 is made of a relatively hard material, which can reduce damage to the third sacrificial layer 74 and the channel 14 located inside the third sacrificial layer 74 during forming of the first metal layer 81 and the second metal layer 82.

Step S23-3: Form the first metal layer on the channel of the first gate, and form the second metal layer on the channel of the second gate.

Figure 18:
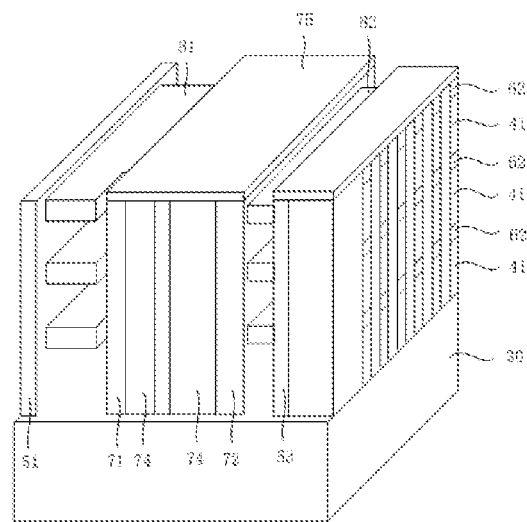
FIG. 18 is a schematic structural diagram after formation of a first metal layer and a second metal layer according to an embodiment of the present disclosure.

Referring to FIG. 17 and FIG. 18, the first metal layer 81 forms one of the drain 13 or source 15 of the first transistor 11, and the second metal layer 82 forms one of the drain 13 or source 15 of the second transistor 12. For example, the first metal layer 81 forms the drain 13 of the first transistor 11, and the second metal layer 82 forms the drain of the second transistor 12. The second metal layer 82 is in contact with the first terminal of the first gate 61, to implement electrical connection between the second metal layer 82 and the first gate 61, such that the subsequently formed first transistor 11 and second transistor 12 are connected along the first direction to form the transistor unit 10.

In some possible embodiments, one first metal layer 81 is formed on the channel 14 of each first gate 61, and the first metal layers 81 are arranged at intervals. One second metal layer 82 is formed on the channel 14 of each second gate 62, and the second metal layers 82 are arranged at intervals. In this way, the first transistors 11 are independent of each other, and the second transistor 12 are independent of each other. Subsequently, it is necessary to form a first bit line 21 that covers and electrically connects a plurality of first metal layers 81 located in a same row, and a second bit line 23 that covers and electrically connects a plurality of second metal layer 82 located in a same row.

In other possible embodiments, as shown in FIG. 18, the forming the first metal layer 81 on the channel 14 of the first gate 61 and forming the second metal layer 82 on the channel 14 of the second gate 62 (step S23-3) may further include: forming the first metal layer 81 on the channels 14 of the first connection layer 46 and the first gate 61 that are arranged in the same layer, and forming the second metal layer 82 on the channels 14 of the second connection layer 47 and the second gate 62 that are arranged in the same layer. In this case, it is unnecessary to manufacture the first bit line 21 and the second bit line 23 separately, that is, subsequent step S24 is not required, thus simplifying the manufacturing steps of the semiconductor structure.

Specifically, referring to FIG. 13 and FIG. 18, along the third direction, each first connection layer 46 corresponds to and arranged in the same layer with one first gate 61; each second connection layer 47 corresponds to and arranged in the same layer with one second gate 62; the channels 14 are formed on the first connection layer 46, the first gate 61, the second connection layer 47, and the second gate 62 respectively.

The first metal layer 81 is formed on the channels 14 of the first connection layer 46 and the first gate 61 arranged in the same layer, and the first metal layers 81 on the channels 14 of the first connection layer 46 and the first gate 61 arranged in different layers are spaced apart. In other words, the first metal layer 81 corresponding to the first connection layer 46 and the first gate 61 is formed as a whole along the second direction, and the first metal layers 81 are stacked and arranged at intervals along the third direction. The first metal layer 81 is used as the first bit line 21, and the first metal layer 81 corresponding to the first gate 61 forms the drain 13/source 15 of the first transistor 11. The first bit line 21 and the drain 13/source 15 of the first transistor 11 can be manufactured at the same time, which simplifies the manufacturing steps of the semiconductor structure.

The second metal layer 82 is formed on the channels 14 of the second connection layer 47 and the second gate 62 arranged in the same layer, and the second metal layers 82 on the channels 14 of the second connection layer 47 and the second gate 62 arranged in different layers are spaced apart. In other words, the second metal layer 82 corresponding to the second connection layer 47 and the second gate 62 is formed as a whole along the second direction, and the second metal layers 82 are stacked and arranged at intervals along the third direction. The second metal layer 82 is used as the second bit line 23, and the second metal layer 82 corresponding to the second gate 62 forms the drain 13/source 15 of the second transistor 12. The second bit line 23 and the drain 13/source 15 of the second transistor 12 can be manufactured at the same time, thereby simplifying the manufacturing steps of the semiconductor structure.

Step S24: Form a first bit line and a second bit line that extend along the second direction, where the first bit line covers the first metal layer, and the second bit line covers the second metal layer.

The first bit lines 21 extend along the second direction, and are stacked and arranged at intervals along the third direction. Each first bit line 21 covers the first metal layers 81 located in the same row along the second direction. The second bit lines 23 extend along the second direction, and are stacked and arranged at intervals along the third direction. Each second bit line 23 covers the second metal layers 82 located in the same row along the second direction.

Step S25: Form a third metal layer and a fourth metal layer, where the third metal layer covers the channel close to the first terminal of the first gate, the fourth metal layer covers the channel at a second terminal of the second gate, the third metal layer and the first metal layer are spaced apart, the fourth metal layer and the second metal layer are spaced apart, and the fourth metal layer is in contact with the first terminal of the first gate.

Figure 19:
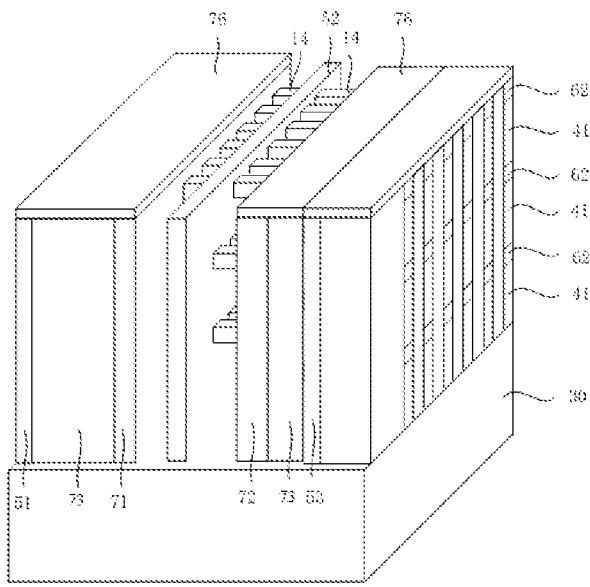
FIG. 19 is a schematic structural diagram after formation of a fourth sacrificial layer according to an embodiment of the present disclosure.
Figure 20:
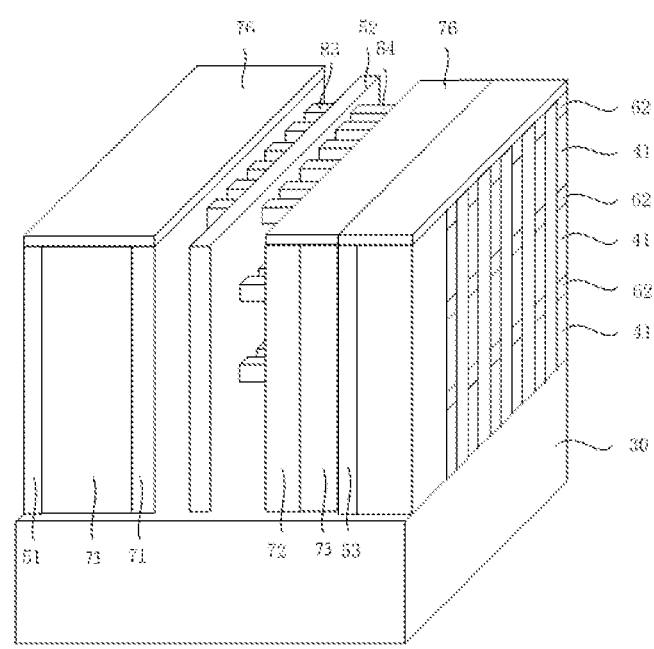
FIG. 20 is a schematic structural diagram after formation of a third metal layer and a fourth metal layer according to an embodiment of the present disclosure.

Referring to FIG. 19 and FIG. 20, the third metal layer 83 covers the lateral periphery of the channel 14 at the first terminal of the first gate 61, and the third metal layer 83 forms the drain 13 or the source 15 of the first transistor 11. The fourth metal layer 84 covers an end surface of the channel 14 that is close to the first terminal of the second gate 62 as well as the lateral periphery close to the end surface, and the fourth metal layer 84 forms the drain 13 or the source 15 of the second transistor 12.

In some possible implementations, the forming a third metal layer and a fourth metal layer (step S25) includes the following steps:

Step S25-1: Form a fourth sacrificial layer between the first support layer and the second isolation layer, and between the second isolation layer and the third support layer, where the fourth sacrificial layer covers the first connection layer and the second connection layer.

Referring to FIG. 13 and FIG. 19, the fourth sacrificial layer 73 fills a space between the first support layer 51 and the second isolation layer 71, and a space between the third isolation layer 72 and the third support layer 53. After the fourth sacrificial layer 73 is formed, the channels 14 on the first connection layer 46 and the second connection layer 47 are not exposed. It may be understood that, before the forming a fourth sacrificial layer 73, the method further includes: removing the third sacrificial layer 74, to expose the channel 14.

In some possible examples, after the fourth sacrificial layer 73 is formed, a second barrier layer 76 is further formed on the fourth sacrificial layer 73. The second barrier layer 76 further covers the second isolation layer 71, the first support layer 51, the third isolation layer 72, and the third support layer 53. The second barrier layer 76 is made of a relatively hard material, which can reduce damage to the fourth sacrificial layer 73 and the channel 14 located inside the fourth sacrificial layer 73 during forming of the third metal layer 83 and the fourth metal layer 84.

Step S25-2: Form the third metal layer on the channel of the first gate, and form the fourth metal layer on the channel of the second gate.

Referring to FIG. 5 and FIG. 20, the third metal layer 83 forms one of the drain 13 or source 15 of the first transistor 11, and the fourth metal layer 84 forms the other of the drain 13 or source 15 of the second transistor 12. For example, the third metal layer 83 forms the source 15 of the first transistor 11, and the fourth metal layer 84 forms the drain 13 of the second transistor 12.

Step S26: Form a first word line and a second word line that extend along the third direction, where the first word line covers the third metal layer, and the second word line covers the first terminal of the second gate.

Referring to FIG. 5 and FIG. 20, the first word lines 22 extend along the third direction, and are arranged at intervals along the second direction. Each first word line 22 covers the third metal layers 83 located in the same column along the third direction. The second word lines 24 extend along the third direction, and are arranged at intervals along the second direction. Each second word line 24 covers end portions of the second gates 62 located in the same column along the third direction.

In conclusion, in the manufacturing method of a semiconductor structure provided by the embodiments of the present disclosure, the electrically connected first transistor 11 and second transistor 12 are formed, and the first transistor 11 and the second transistor 12 both extend along the first direction that is parallel to the substrate 30, which facilitates manufacturing of the first transistor 11 and the second transistor 12 and improves the yield of the semiconductor structure, and also increases the quantity of stacked first transistors 11 and second transistors 12, thereby improving the storage capacity of the semiconductor structure. In addition, a 2T0C semiconductor structure is formed by one of the first transistor 11 and the second transistor 12 as a storage node, to reduce the area occupied by the memory cell, thereby improving the storage density of the semiconductor structure.

The foregoing embodiments are used only to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A semiconductor structure, comprising:
   a substrate;
   a memory cell array, located on the substrate, wherein the memory cell array comprises a plurality of transistor units, each of the transistor units comprises a first transistor and a second transistor extending along a first direction and electrically connected to each other, and the first direction is parallel to the substrate;
   a first bit line, penetrating the memory cell array and electrically connected to the first transistor;
   a second bit line, penetrating the memory cell array and electrically connected to the second transistor;
   a first word line, electrically connected to the first transistor; and
   a second word line, electrically connected to the second transistor.

2. The semiconductor structure according to claim 1, wherein a plurality of first bit lines, a plurality of first word lines, a plurality of second bit lines, and a plurality of second word lines are provided;
   the plurality of first word lines and the plurality of second word lines extend along a third direction and are electrically isolated from each other; and
   the plurality of first bit lines and the plurality of second bit lines extend along a second direction and are electrically isolated from each other; and/or a first step is formed at an end of the plurality of first bit lines that is away from the memory cell array, and a second step is formed at an end of the plurality of second bit lines that is away from the memory cell array.

3. The semiconductor structure according to claim 2, wherein the first step and the second step are located at a same side of the memory cell array.

4. The semiconductor structure according to claim 2, wherein each of the first bit lines is electrically connected to a plurality of first transistors that are located in a same row along the second direction; and each of the first word lines is electrically connected to a plurality of first transistors that are located in a same column along the third direction; and
   each of the second bit lines is electrically connected to a plurality of second transistors that are located in a same row along the second direction; and each of the second word lines is electrically connected to a plurality of second transistors that are located in a same column along the third direction.

5. The semiconductor structure according to claim 1, wherein the first transistor and the second transistor each comprise:
   a channel, in which an accommodation space is formed;
   a gate, provided with a first terminal and a second terminal that are opposite to each other along the first direction, wherein the first terminal of the gate is located outside the accommodation space, and the second terminal of the gate is located in the accommodation space;
   a dielectric layer, located between the gate and the channel and isolating the gate from the channel in an insulated manner;
   a source, provided at one end of the channel; and
   a drain, provided at the other end of the channel, wherein the drain and the source are arranged at an interval along the first direction.

6. The semiconductor structure according to claim 5, wherein the channel comprises a top wall, a bottom wall, and a sidewall that define the accommodation space, the top wall is provided with an opening, and the second terminal of the gate is exposed outside the accommodation space via the opening; and
   the source covers the bottom wall of the channel and covers a part of the sidewall close to the bottom wall, and the drain covers the top wall of the channel and covers a part of the sidewall close to the top wall.

7. The semiconductor structure according to claim 5, wherein a material of the channel comprises one from the group consisting of indium gallium zinc oxide, polysilicon, monocrystalline silicon, silicon germanide and silicon carbide.

8. The semiconductor structure according to claim 5, wherein the first bit line is electrically connected to the drain of the first transistor, and the first word line is electrically connected to the source of the first transistor;
   the second bit line is electrically connected to the source of the second transistor, and the second word line is electrically connected to the gate of the second transistor; and
   the gate of the first transistor is electrically connected to the drain of the second transistor.

9. The semiconductor structure according to claim 8, wherein along the first direction, a first isolation layer is further provided between the second bit line and the second word line, to isolate the second bit line from the second word line in an insulated manner, and the second transistor penetrates the first isolation layer.

10. The semiconductor structure according to claim 1, wherein the semiconductor structure further comprises a first bit line plug, a second bit line plug, a first word line plug, and a second word line plug that extend along a third direction; and
   the first bit line plug is electrically connected to the first bit line, the second bit line plug is electrically connected to the second bit line, the first word line plug is electrically connected to the first word line, and the second word line plug is electrically connected to the second word line.

11. A manufacturing method of a semiconductor structure, comprising:
   providing a substrate; and
   forming a memory cell array, first bit lines, second bit lines, first word lines, and second word lines on the substrate;
   wherein the memory cell array comprises a plurality of transistor units, each of the transistor units comprises a first transistor and a second transistor extending along a first direction and electrically connected to each other, and the first direction is parallel to the substrate; and
   the first bit line penetrates the memory cell array and is electrically connected to the first transistor; the second bit line penetrates the memory cell array and is electrically connected to the second transistor; the first word line is electrically connected to the first transistor; and the second word line is electrically connected to the second transistor.

12. The manufacturing method according to claim 11, wherein the forming a memory cell array, first bit lines, second bit lines, first word lines, and second word lines on the substrate comprises:
   forming a first gate array and a second gate array that are arranged at an interval along the first direction on the substrate, wherein the first gate array comprises a plurality of first gates that are arranged at intervals along a second direction and arranged at intervals along a third direction, and the second gate array comprises a plurality of second gates that are arranged at intervals along the second direction and arranged at intervals along the third direction;
   forming a dielectric layer on the first gate and the second gate, and forming a channel on the dielectric layer, wherein first terminals of the first gate and the second gate both extend to outsides of the corresponding channels;
   forming a first metal layer and a second metal layer, wherein the first metal layer covers the channel located at a second terminal of the first gate, the second metal layer covers the channel close to the first terminal of the second gate, and the second terminal and the first terminal are opposite to each other along the first direction;
   forming a first bit line and a second bit line that extend along the second direction, wherein the first bit line covers the first metal layer, and the second bit line covers the second metal layer;
   forming a third metal layer and a fourth metal layer, wherein the third metal layer covers the channel close to the first terminal of the first gate, the fourth metal layer covers the channel at a second terminal of the second gate, the third metal layer and the first metal layer are spaced apart, the fourth metal layer and the second metal layer are spaced apart, and the fourth metal layer is in contact with the first terminal of the first gate; and
   forming a first word line and a second word line that extend along the third direction, wherein the first word line covers the third metal layer, and the second word line covers the first terminal of the second gate.

13. The manufacturing method according to claim 12, wherein the forming a first gate array and a second gate array that are spaced apart along the first direction on the substrate comprises:

forming a first laminated structure on the substrate, wherein the first laminated structure has a first region and a second region, and the first laminated structure comprises first sacrificial layers and initial gate layers that are arranged alternately along the third direction;

removing a part of the first laminated structure, to form a first trench that extends along the first direction in the first region, and form a second trench that extends along the second direction in the second region, wherein the first trench partitions the initial gate layers in the first region into a plurality of initial gate pillars, and the second trench partitions the initial gate layers in the second region into a first connection layer and a second connection layer; and separating the plurality of initial gate pillars into the first gate array and the second gate array along the first direction.

14. The manufacturing method according to claim 13, wherein the separating the plurality of initial gate pillars into the first gate array and the second gate array along the first direction comprises:

forming a second sacrificial layer in the first trench and the second trench;

forming a first support layer, a second support layer, and a third support layer that are spaced part along the first direction in the second sacrificial layer and the first laminated structure, wherein the first support layer connects the initial gate pillar and the first connection layer, the third support layer connects the initial gate pillar and the second connection layer, and the second support layer connects the initial gate pillars; and removing a part of the second sacrificial layer, a part of the first sacrificial layer, and a part of the initial gate pillar at lateral sides of the second support layer of the first region, to form the first gate array and the second gate array; and removing the remaining second sacrificial layer and first sacrificial layer.

15. The manufacturing method according to claim 14, wherein the forming a dielectric layer on the first gate and the second gate, and forming a channel on the dielectric layer comprises:

forming dielectric layers on the first gate, the second gate, the first connection layer, and the second connection layer respectively.

16. The manufacturing method according to claim 15, wherein the forming a first metal layer and a second metal layer comprises:

forming a second isolation layer between the first support layer and the second support layer, and forming a third isolation layer between the second support layer and the third support layer;

forming a third sacrificial layer between the second isolation layer and the second support layer, and between the second support layer and the third isolation layer; and forming the first metal layer on the channel of the first gate, and forming the second metal layer on the channel of the second gate.

17. The manufacturing method according to claim 16, wherein the forming a third metal layer and a fourth metal layer comprises:

forming a fourth sacrificial layer between the first support layer and the second isolation layer, and between the third isolation layer and the third support layer, wherein the fourth sacrificial layer covers the first connection layer and the second connection layer; and forming the third metal layer on the channel of the first gate, and forming the fourth metal layer on the channel of the second gate.

* * * * *